(12) United States Patent
Hirler et al.

(10) Patent No.: US 11,133,391 B2
(45) Date of Patent: Sep. 28, 2021

(54) TRANSISTOR DEVICE

(71) Applicant: Infineon Technologies Austria AG, Villach (AT)

(72) Inventors: Franz Hirler, Isen (DE); Cesar Augusto Braz, Villach (AT); Gerhard Noebauer, Villach (AT); Martin Henning Vielemeyer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 67 days.

(21) Appl. No.: 16/572,031

(22) Filed: Sep. 16, 2019

(65) Prior Publication Data

US 2020/0091300 A1 Mar. 19, 2020

(30) Foreign Application Priority Data

Sep. 17, 2018 (EP) .................................... 18194736

(51) Int. Cl.
*H01L 29/40* (2006.01)
*H01L 29/66* (2006.01)
(Continued)

(52) U.S. Cl.
CPC ........ *H01L 29/407* (2013.01); *H01L 29/4236* (2013.01); *H01L 29/66734* (2013.01); *H01L 29/7808* (2013.01); *H01L 29/7813* (2013.01)

(58) Field of Classification Search
CPC . H01L 29/404; H01L 29/407; H01L 29/4236; H01L 29/66734; H01L 29/7813;
(Continued)

(56) References Cited

U.S. PATENT DOCUMENTS

| 5,079,608 A * | 1/1992 | Wodarczyk | H01L 27/0251 257/355 |
| 6,677,641 B2 * | 1/2004 | Kocon | H01L 29/404 257/329 |

(Continued)

FOREIGN PATENT DOCUMENTS

| DE | 102005047056 B3 * | 1/2007 | ........... H01L 29/407 |
| JP | 2003243655 A * | 8/2003 | ........... H01L 29/407 |
| JP | 2003243655 A | 8/2003 | |

OTHER PUBLICATIONS

Machine translation, Hanaoka, Japanese Pat. Pub. No. JP 2003-243655A, translation date: Jan. 11, 2021, Espacenet, all pages. (Year: 2021).*

(Continued)

*Primary Examiner* — Victoria K. Hall
(74) *Attorney, Agent, or Firm* — Murphy, Bilak & Homiller, PLLC

(57) ABSTRACT

A transistor device includes, in a semiconductor body, a drift region, a body region, and a source region separated from the drift region by the body region and connected to a source node. The transistor device further includes a gate electrode dielectrically insulated from the body region by a gate dielectric, and a field electrode structure. The field electrode structure includes: a first field electrode connected to the source node and dielectrically insulated from the drift region by a first field electrode dielectric; a second field electrode dielectrically insulated from the drift region by a second field electrode dielectric; and a coupling circuit connected between the second field electrode and the source node and configured to connect the second field electrode to the source node dependent on a voltage between the source node and the second field electrode.

21 Claims, 11 Drawing Sheets

(51) Int. Cl.
*H01L 29/423* (2006.01)
*H01L 29/78* (2006.01)

(58) Field of Classification Search
CPC ......... H01L 29/66106; H01L 29/66371; H01L 29/7803; H01L 29/7808
See application file for complete search history.

(56) References Cited

U.S. PATENT DOCUMENTS

| | | | |
|---|---|---|---|
| 6,991,977 B2* | 1/2006 | Kocon | H01L 29/404 257/E29.121 |
| 7,368,777 B2* | 5/2008 | Kocon | H01L 21/823487 257/302 |
| 7,465,987 B2* | 12/2008 | Krumrey | H01L 29/407 257/330 |
| 7,638,841 B2* | 12/2009 | Challa | H01L 29/7802 257/341 |
| 7,768,064 B2* | 8/2010 | Sapp | H01L 29/7803 257/330 |
| 7,772,668 B2* | 8/2010 | Pan | H01L 29/407 257/492 |
| 8,748,976 B1* | 6/2014 | Kocon | H01L 29/66734 257/330 |
| 8,786,045 B2* | 7/2014 | Challa | H01L 29/0661 257/490 |
| 9,171,841 B2* | 10/2015 | Hirler | H01L 27/04 |
| 9,299,830 B1* | 3/2016 | Kawahara | H01L 29/404 |
| 9,373,700 B2* | 6/2016 | Hirler | H01L 29/861 |
| 9,941,276 B2* | 4/2018 | Zundel | H01L 28/40 |
| 2005/0082591 A1* | 4/2005 | Hirler | H01L 29/402 257/302 |
| 2007/0138544 A1* | 6/2007 | Hirler | H01L 29/7808 257/330 |
| 2011/0133272 A1* | 6/2011 | Mauder | H01L 29/66719 257/335 |
| 2011/0163366 A1* | 7/2011 | Zundel | H01L 21/02233 257/301 |
| 2012/0043602 A1* | 2/2012 | Zeng | H01L 29/66727 257/330 |
| 2012/0217581 A1 | 8/2012 | Kondou | |
| 2016/0035862 A1* | 2/2016 | Hirler | H01L 29/732 438/237 |
| 2018/0212027 A1* | 7/2018 | Cai | H01L 29/404 |
| 2019/0371899 A1* | 12/2019 | Wutte | H01L 29/407 |

OTHER PUBLICATIONS

Machine translation, Hirler, German Pat. Pub. No. DE 10-2005-047056B3, translation date: Jan. 13, 2021, Espacenet, all pages. (Year: 2021).*

* cited by examiner

TRANSISTOR DEVICE

TECHNICAL FIELD

This disclosure in general relates to a transistor device, in particular, a transistor device with a field electrode structure.

BACKGROUND

Transistor devices such as insulated gate power transistor devices are widely used as electronic switches or active rectifier elements in various types of electronic circuits. An insulated gate power transistor device such as a MOSFET (Metal Oxide Semiconductor Field-Effect Transistors) or an IGBT (Insulated Gate Bipolar Transistors) is a voltage controlled device that includes a load path between two load nodes and a drive input and that switches on or off dependent on a drive voltage received at the drive input. In a MOSFET, for example, the load path is a circuit path between a drain node and a source node and the drive input is formed by a gate node and the source node.

In a typical application, there are operating scenarios in which the transistor device changes from a conducting state to a blocking state so that a voltage across the load path increases. An increasing voltage across the load path is associated with charging a parasitic capacitor (which is often referred to as output capacitor) of the transistor device. Together with inevitable parasitic inductances the output capacitor forms a parasitic oscillating circuit. Parasitic inductances include, for example, inductances of connection lines between the load path of the transistor device and a load or between the load path of the transistor device and a voltage source providing a supply voltage. This parasitic oscillating circuit causes the load path voltage to oscillate in a transient phase of the transistor device from the conducting state to the blocking state, so that voltage spikes may occur. These voltage spikes can be significantly higher than the load path voltage in a steady state, that is, after the transient phase.

Voltage spikes higher than a voltage blocking capability of the transistor device may destroy or degrade the transistor device. The voltage blocking capability is the maximum load path voltage the transistor device can withstand in the off-state. The transistor device can be designed such that its voltage blocking capability is adapted to the voltage spikes that may occur. However, conduction losses and, last but not least, the price of transistor devices increase as the voltage blocking capability increases.

In general, the higher a capacitance value of the output capacitance the longer the load path voltage may oscillate and the higher the voltage spikes. Thus, reducing the duration and the amplitude of such oscillations is of particular interest in transistor devices with a high output capacitance. Examples of transistor devices with a high output capacitance include transistor devices with a drift region and a field electrode structure located in the drift region. A field electrode structure is one way to reduce the on-resistance, which is the electrical resistance of the load path in the on-state, without decreasing the voltage blocking capability.

There is therefore a need to reduce parasitic oscillations, in particular, the (maximum) amplitude of parasitic oscillations, in a transistor device with a field electrode structure.

SUMMARY

One example relates to a transistor device. The transistor device includes, in a semiconductor body, a drift region, a body region, and a source region. The source region is separated from the drift region by the body region and connected to a source node. The transistor device further includes a gate electrode dielectrically insulated from the body region by a gate dielectric, and a field electrode structure. The field electrode structure includes a first field electrode connected to the source node and dielectrically insulated from the drift region by a first field electrode dielectric, a second field electrode dielectrically insulated from the drift region by a second field electrode dielectric, and a coupling circuit connected between the second field electrode and the source node. The coupling circuit is configured to connect the second field electrode to the source node dependent on a voltage between the source node and the second field electrode.

Those skilled in the art will recognize additional features and advantages upon reading the following detailed description, and upon viewing the accompanying drawings.

BRIEF SUMMARY OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
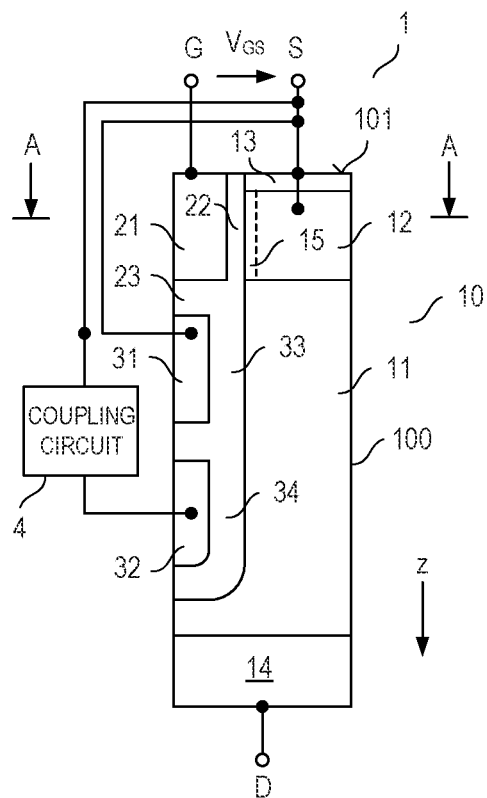
FIG. 1 shows a vertical cross sectional view of a transistor device with a field electrode structure according to one example.

FIG. 1 shows a transistor device 1 according to one example. More specifically, FIG. 1 shows a vertical cross sectional view of one section of a semiconductor body 100 in which active regions of the transistor device 1 are integrated. The "vertical cross sectional view" is a view in a section plane that is perpendicular to a first surface 101 of the semiconductor body 100. Referring to FIG. 1, the transistor device includes, in the semiconductor body 100, a drift region 11, a body region 12, and a source region 13. The source region 13 is separated from the drift region 11 by the body region 12 and is connected to a source node S. The source node S is only schematically illustrated in FIG. 1 and may include a metallization and/or a highly doped polycrystalline semiconductor material connected to the source region 13. According to one example (as illustrated in FIG. 1), the body region 12 is also connected to the source node S, wherein a connection between the body region 12 and the source node S is only schematically illustrated in FIG. 1.

The transistor device further includes a gate structure and a field electrode structure. The gate structure includes a gate electrode 21 that is arranged adjacent to the body region 12 and is dielectrically insulated from the body region 12 by a gate dielectric 22. The field electrode structure includes a first field electrode 31, a second field electrode 32, and a coupling circuit 4. The first field electrode 31 is arranged adjacent to the drift region 11 and is dielectrically insulated from the drift region by a first field electrode dielectric 33, and the second field electrode 32 is arranged adjacent to the drift region 11 and is dielectrically insulated from the drift region 11 by a second field electrode dielectric 34. The first field electrode 31 is electrically connected to the source node S, and the coupling circuit 4 is connected between the second field electrode 32 and the source node S, wherein connections between the first field electrode 31 and the source node S, between the second field electrode 32 and the coupling circuit 4, and between the coupling circuit 4 and the source node S are only schematically illustrated in FIG. 1. The coupling circuit 4 is configured to electrically connect the second field electrode 32 to the source node S dependent on a voltage between the source node S and the second field electrode 32. The coupling circuit 4 is only represented by a circuit block in FIG. 1; examples of how the coupling circuit 4 may be implemented are explained herein further below.

Referring to FIG. 1, the transistor device may further include a drain region 14. The drain region is spaced apart from the body region 13 and is separated from the body region 13 by the drift region 11. According to one example, the drain region 14 is spaced apart from the field electrode structure. According to another example (not shown), the field electrode structure adjoins the drain region 14 or extends into the drain region 14. In any case, the field electrodes 31, 32 are dielectrically insulated from the drain region 14. Optionally, a field stop region (not shown) of the same doping type as the drift region 11 and higher doped than the drift region 11 is arranged between the drain region 14 and the drift region 11. The transistor device may be implemented as a vertical transistor device, as shown in FIG. 1. In this case, the drain region 14 is spaced apart from the source region 13 in a vertical direction z of the semiconductor body 100. "The vertical direction" is a direction perpendicular to the first surface 101 of the semiconductor body. However, the principles explained herein also apply to a lateral transistor device (not shown) in which the drain region and the source region are spaced apart from each other in a horizontal direction (which is parallel to the first surface) of the semiconductor body.

The semiconductor body 100 may include a conventional monocrystalline semiconductor material such as silicon (Si), silicon carbide (SiC), gallium arsenide (GaAs), gallium nitride (GaN) or the like. According to one example, the source region 13 and the drift region 11 are semiconductor regions of a first doping type (conductivity type) and the drift region 11 is a semiconductor regions of a second doping type (conductivity type) complementary to the first doping type. Thus, a pn-junction is formed between the body region 12 and the drift region 11.

The transistor device shown in FIG. 1 is a voltage controlled transistor device that switches on or switches off dependent on a drive voltage $V_{GS}$ (which is usually referred to as gate-source voltage) applied between the gate node and the source node. The drive voltage $V_{GS}$ controls a conducting channel in the body region 12 between the source region 13 and the drift region 11, wherein the transistor device is in an on-state (conducting state) when there is a conducting channel in the body region 12 between the source region 13 and the drift region 11, and in an off-state (blocking state) when there is no such conducting channel. In the on-state, the transistor device can conduct a current between the drain node D and the source node S when a corresponding voltage $V_{DS}$, which is referred to as drain-source voltage in the following, is applied between these circuit nodes D, S.

The transistor device can be implemented as an n-type transistor device or as a p-type transistor device. In an n-type transistor device, the drift region 11 and the source region 13 are n-doped and the body region 12 is p-doped. In a p-type transistor device, the doping types of the individual device regions are complementary to the doping types of the corresponding device regions in an n-type transistor device. The transistor device can be implemented as an enhancement (normally-off) device or as a depletion (normally-on) device. In an enhancement device, the body region 12, which has a doping type complementary to the doping type of the source region 13 and the drift region 11, adjoins the gate dielectric 22. In a depletion device, there is a channel region 15 (illustrated in dashed lines in FIG. 1) of the same doping type as the drift region 11 and the source region 13 that extends along the gate dielectric 22 between the source region 13 and the drift region 11. In any case, the gate electrode 21 serves to control a conducting channel along the gate dielectric 22 between the source region 13 and the drift region 11. An enhancement device is in the on-state when the gate electrode 21 is driven such that there is an inversion channel in the body region 12 along the gate dielectric 22 and in the off-state when the inversion channel is interrupted. A depletion device is in the off-state when the gate electrode 21 is driven such that the channel region 15 along the gate dielectric 21 is depleted and in the on-state when the channel region is not depleted. Further, the transistor device can be implemented as a MOSFET or as an IGBT. In a MOSFET, the drain region 14 has the same doping type as the drift region 11. In an IGBT, the drain region 14 (which may also be referred to as collector region) has a doping type complementary to the doping type of the drift region 11. It should be noted that the term MOSFET as used herein denotes any type of field-effect transistor with an insulated gate electrode (sometimes referred to as IGFET) independent of whether the gate electrode 21 includes a metal or another type of electrically conducting material, and independent of whether the gate dielectric 22 includes an oxide or another type of dielectrically insulating material.

A doping concentration of the drain region 14 is, for example, between $1E19$ $cm^{-3}$ and $1E22$ $cm^{-3}$, a doping concentration of the drift region 11 is, for example, between $1E13$ $cm^{-3}$ and $5E17$ $cm^{-3}$, in particular between $1E16$ $cm^{-3}$ and $2E17$ $cm^{-3}$, a doping concentration of the body region 12 is, for example, between $1E16$ $cm^{-3}$ und $1E18$ $cm^{-3}$, and the doping concentration of the source region 13 is, for example, between $1E19$ $cm^{-3}$ und $1E21$ $cm^{-3}$.

Referring to FIG. 1, the first field electrode 31 and the second field electrode 32 may be arranged one above the other in a first trench extending from the first surface 101 into the semiconductor body 100, wherein the first field electrode 31 is closer to the body and source regions 12, 13 than the second field electrode 32 and the second field electrode 32 is closer to the drain region 14 than the first field electrode 31. In this example, the gate electrode 21 is insulated from the first field electrode 31 by an insulation layer 23. The insulation layer 23 may include the same material as the first field electrode dielectric 33 and the second field electrode dielectric 34.

Figure 2:
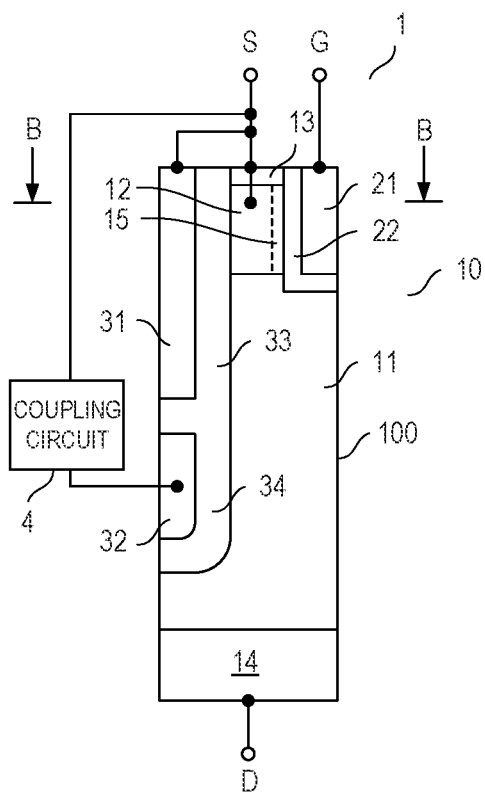
FIG. 2 shows a modification of the transistor device shown in FIG. 1.

According to another example shown in FIG. 2, the gate electrode 21 is arranged in a second trench that is spaced apart from the first trench. According to another example (not illustrated) the gate electrode 21 is a planar electrode formed on top of a first surface 101 of the semiconductor body 100.

Each of the gate electrode 21, the first field electrode 31 and the second field electrode 32 includes an electrically conducting material such as a metal or a highly doped polycrystalline semiconductor material, where these electrodes 21, 31, 32 may include the same type of material or different types of material. Each of the gate dielectric 22, the first field electrode dielectric 33, and the second field electrode 31 dielectric may include an oxide, a nitride, or combinations thereof.

When the transistor device is in the off-state and a voltage is applied between the drain node D and the source node S that reverse biases the pn-junction between the drift region 11 and the body region 12 a space charge region (depletion region) expands in the drift region 11 beginning at the pn-junction. The higher the voltage applied between the drain node D and the source node S is, the farther the space charge region expands in the direction of the drain region 14. The space charge region is associated with ionized dopant atoms in the drift region 11 and ionized dopant atoms in the body region 12. A certain amount of ionized dopant atoms in the drift region 11 is compensated by the first field electrode 31, that is, a certain amount of ionized dopant atoms in the drift region 11 has a corresponding countercharge in the first field electrode 31. As will be explained herein further below, a potential of the second field electrode 32 essentially equals the source potential (the electrical potential of the source node S) or is different from the source potential by a predefined voltage when the transistor device is in the steady state. Thus, another portion of ionized dopant atoms is compensated by the second field electrode 32 when the transistor device is in the off-state. The compensation effect provided by the field electrode structure with the first field electrode 31 and the second field electrode 32 makes it possible to implement the drift region 11 with a higher doping concentration than a transistor device without field electrode structure, thereby reducing the on-resistance without decreasing the voltage blocking capability. The "on-resistance" is the electrical resistance of the transistor device in the on-state, and the "voltage blocking capability" is the maximum voltage the transistor device can withstand in the off state.

Figure 3:
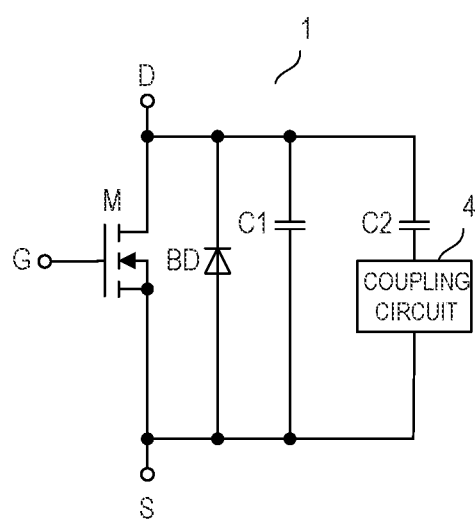
FIG. 3 shows an equivalent circuit diagram of a transistor device of any of the types shown in FIGS. 1 and 2.

FIG. 3 shows an equivalent circuit diagram of the transistor devices shown in FIGS. 1 and 2. Just for the purpose of illustration it is assumed that the transistor device is a MOSFET, more specifically, an n-type enhancement MOSFET. The circuit symbol of the MOSFET M shown in FIG. 3 represents the device structure with the source region 13, the body region 12, the drift region 11, the drain region 14, the gate electrode 21, and the gate dielectric 22. A bipolar diode connected in parallel with the load path (drain-source path) D-S of the MOSFET M represents the body diode of the transistor device, which is a diode formed by the body region 12, the drift region 11, the drain region 14 and the pn-junction between the body region 12 and the drift region 11. Referring to FIG. 3, the equivalent circuit diagram further includes a first capacitor C1 and a second capacitor C2. The first capacitor C1 is connected in parallel with the drain-source path D-S of the MOSFET M and is formed by the first field electrode 31, the first field electrode dielectric 33, the drift region 11 and the drain region 14. The second capacitor C2 is formed by the second field electrode 32, the second field electrode dielectric 34, the drift region 11 and the drain region 14. The second capacitor C2 is connected in series with the coupling circuit 4, wherein the series circuit including the second capacitor C2 and the coupling circuit 4 is connected between the drain node D and the source node S.

Referring to the above, the coupling circuit 4 and the first field electrode 31 are connected to the source node S. Referring to FIGS. 1 and 2, the coupling circuit 4 and the first field electrode 31 may be connected to the source node S independently. According to another example shown in FIG. 4, the coupling circuit 4 is connected to the first field electrode 31 so that the coupling circuit 4 is connected to the source node S via the electrically conducting first field electrode 31.

Figure 4:
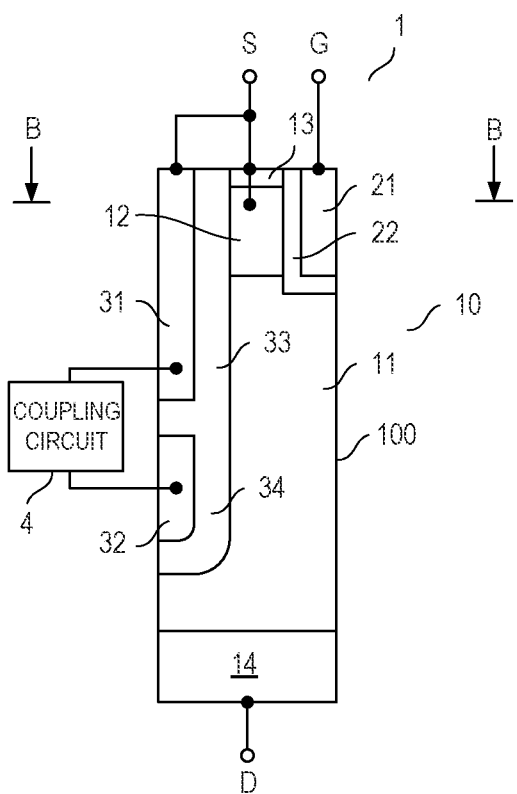
FIG. 4 shows a modification of the transistor device shown in FIG. 2.

According to one example, the coupling circuit 4 is connected to the first field electrode 31 and a first end facing the second field electrode 32, and the first field electrode 31 is connected to the source node S at a second and opposite the first end. The transistor device shown in FIG. 4 is based on the example shown in FIG. 2 in which the field electrode structure and the gate structure are arranged in different trenches. This, however, is only an example. The coupling scheme illustrated in FIG. 4 can be applied to a transistor device of the type shown in FIG. 1 as well.

Figure 5:
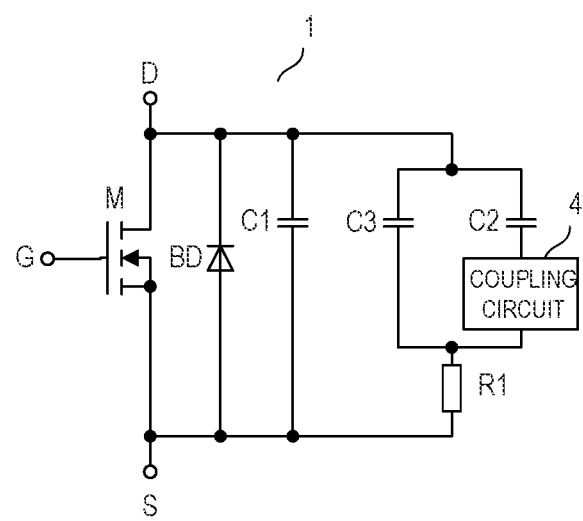
FIG. 5 shows an equivalent circuit diagram the transistor device shown in FIG. 4.

FIG. 5 shows an equivalent circuit diagram of the transistor device shown in FIG. 4. This circuit diagram is different from the circuit diagram shown in FIG. 3 in that it additionally includes a resistor R1 connected in series with the second capacitor C2 and the coupling circuit 4, and third capacitor C3 connected in parallel with the series circuit including the second capacitor C2 and the coupling circuit 4. This resistor R1 results from an electrical resistance of the first field electrode 31 between those positions where the coupling circuit 4 is connected to the first field electrode 31 and the first field electrode 31 is connected to the source node S. The third capacitor C3 is formed by: a section of the first field electrode 31 that faces the second field electrode 32 and to which the coupling circuit 4 is connected; by a section of the first field electrode dielectric 33 adjoining this section of the first field electrode 31; the drift region 11; and the drain region 14.

Figures 6, 7:
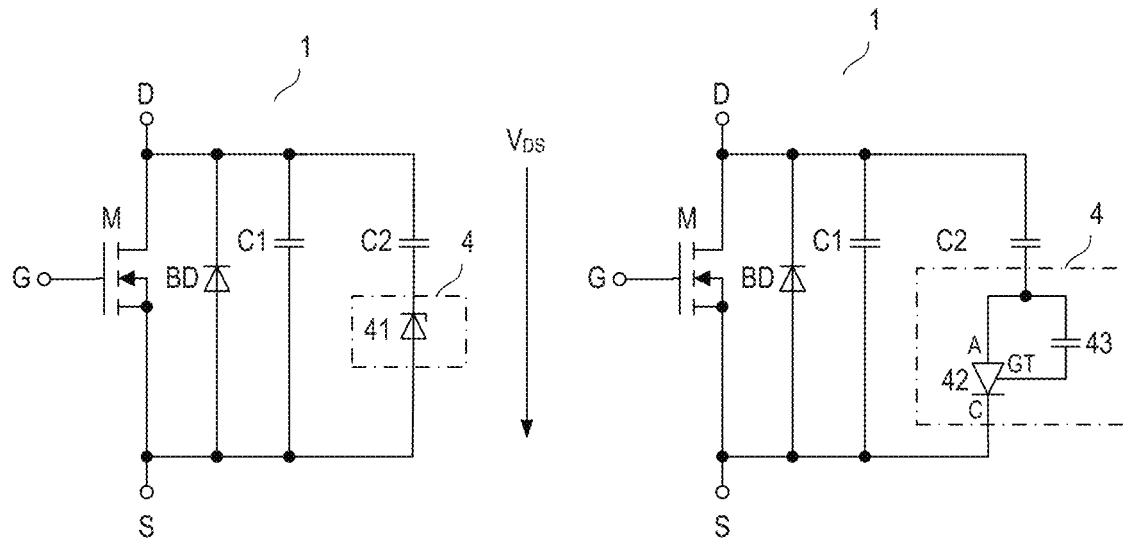
FIG. 6 illustrates one example of a coupling circuit of the field electrode structure.
FIG. 7 illustrates another example of the coupling circuit.

Referring to the above, the coupling circuit 4 is configured to connect the second field electrode 32, which is represented by the second capacitor C2 in FIGS. 3 and 5, to the source node S dependent on a voltage between the source node S and the second field electrode 32. According to one example, the coupling circuit 4 is configured to connect the field electrode 32 to the source node S when a voltage level of the voltage between the source node S and the field electrode 32 exceeds a predefined threshold. FIG. 6 shows one example of a coupling circuit of this type.

Referring to FIG. 6, the coupling circuit 4 includes a Zener diode 41 connected in series with the second capacitor C2. The predefined threshold is given by the Zener voltage (breakthrough voltage) of the Zener diode 41. Referring to the above a space charge region expands in the drift region 11 of the transistor device when the transistor device is in the off-state and when a voltage is applied between the drain node D and the source node S that reverse biases the pn-junction between the body region 12 and the drift region 11, wherein a portion of the ionized dopant atoms associated with the space charge region are compensated by the field electrode structure. Such compensation is associated with a charging of the field electrode structure when the transistor device switches off and a discharging of the field electrode structure when the transistor device switches on. Referring to FIG. 6, when the coupling circuit 4 is implemented with a Zener diode 41, when the transistor device is in the off-state and when the voltage between the drain node D and the source node S increases, the first capacitor C1 (that includes the first field electrode 31 and the first field electrode dielectric 33) is charged right from the beginning of the off-state and, therefore, compensates ionized dopant atoms right from the beginning of the off-state. The second capacitor C2 (that includes the second field electrode 32 and the second field electrode dielectric 34) is not charged and, therefore, does not compensate ionized dopant atoms until the voltage $V_{DS}$ between the drain node D and the source node S reaches the Zener voltage of the Zener diode 41. After the drain-source voltage has reached the Zener voltage of the Zener diode 41, the second field electrode 32 is coupled to the source node S and the potential of the second field electrode 32 is essentially given by the source potential plus the Zener voltage. Thus, the output capacitance of the transistor device increases as the off-state prevails. When the transistor device switches on, so that the drain-source voltage $V_{DS}$ decreases, both the first capacitor C1 and the second capacitor C2 are discharged simultaneously.

According to one example, the Zener diode is implemented such that the Zener voltage is between 5% and 20% of the voltage blocking capability of the transistor device. According to another example, the Zener diode is implemented such that the Zener voltage is between 5V and 15V.

According to another example, the coupling circuit 4 is configured to connect the second field electrode 32 to the source node S when a rise rate of the voltage between the source node S and the second field electrode 32 exceeds a predefined rate threshold. An example of a coupling circuit 4 of this type is illustrated in FIG. 7.

The coupling circuit according to FIG. 7 includes a thyristor 42 with anode node A, a cathode node C and a gate node GT, and a capacitor 43 connected between the anode node A and the gate node GT. In this example, the thyristor 42 connects the second field electrode 32 included in the second capacitor C2 to the source node S when the thyristor receives a current pulse with a current level higher than a predefined threshold current level of the thyristor 42. In the coupling circuit illustrated in FIG. 7, the capacitor 43 connected to the gate node GT of the thyristor 42 generates a current pulse when the drain-source voltage $V_{DS}$ increases, wherein a current level of this current pulse is dependent on a rise rate of the drain-source voltage $V_{DS}$ and a capacitance C43 of the capacitor 43. Basically the current level is proportional to the rise rate $dV_{DS}/dt$ of the drain-source voltage $V_{DS}$ and proportional to the capacitance C43. Thus, taking into account the on-threshold of the thyristor 42 the capacitor 43 can be selected such that the thyristor 42 switches on when the rise rate of the drain-source voltage $V_{DS}$ reaches a predefined rise-threshold.

The equivalent circuit diagrams shown in FIGS. 6 and 7 are based on the equivalent circuit diagram shown in FIG. 3. This, however, is only an example. The explanation provided above with regard to the function of the coupling circuits 4 shown in FIGS. 6 and 7 apply to a transistor device of the type shown in FIG. 4 and its equivalent circuit diagram shown in FIG. 5 equivalently.

Each of the coupling circuits 4 shown in FIGS. 6 and 7 has the effect that there is a short delay time between a time instance when the first capacitor C1 including the first field electrode 31 is charged and the time instance when the second capacitor C2 including the second field electrode 32 is charged. This reduces the output capacitance of the transistor device at the beginning of the off-state and may help to reduce voltage overshoots when the transistor device switches from the on-state to the off-state. This is explained with reference to FIGS. 8 and 9 in the following.

Figure 8:
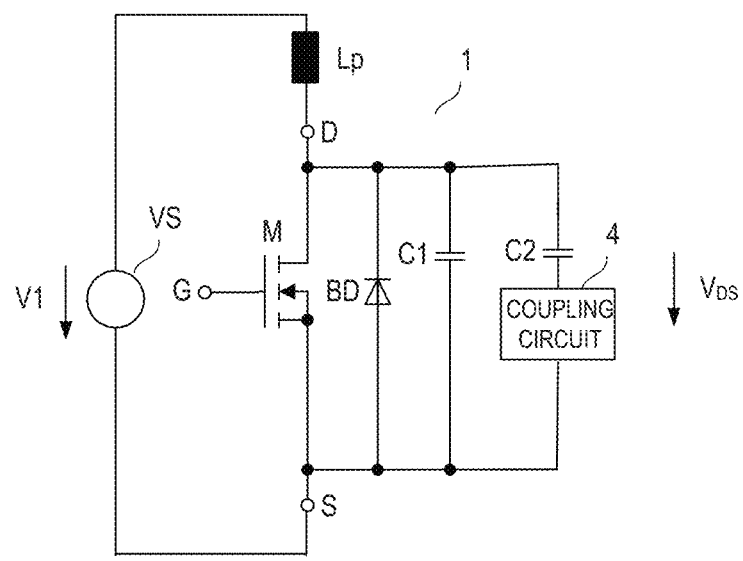
FIG. 8 illustrates an operating scenario of the transistor device.
Figure 9:
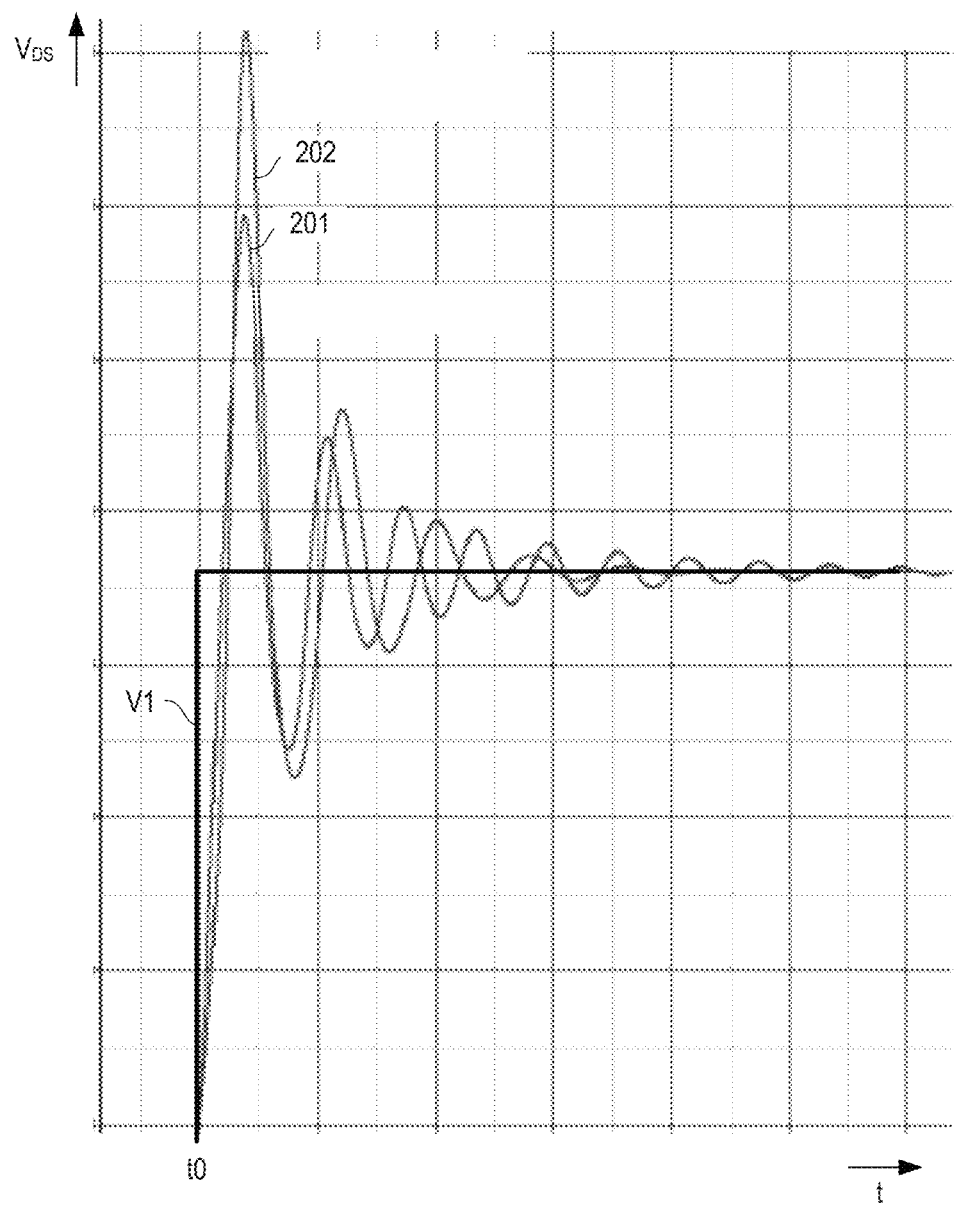
FIG. 9 shows signal waveforms of a load path voltage of a transistor device of the type shown in FIG. 6 and a conventional transistor device.

In FIG. 9 curve 201 illustrates the drain-source voltage $V_{DS}$ of a transistor device implemented in accordance with any of the examples explained herein before when the transistor device is connected in series with an inductance and when a voltage V1 applied to the series circuit with the transistor device and the inductance rapidly increases. This is a typical scenario when the transistor device is used as an electronic switch connected in series with a load and when the transistor device switches off. FIG. 8 shows an equivalent circuit diagram of an electronic circuit that can be used to test the behavior of the transistor device when switching from the on-state to the off-state and, therefore, to obtain curve 201. This electronic circuit includes an inductance Lp connected in series with the drain-source path of the transistor device 1 and a voltage source VS, wherein the voltage source VS is configured to rapidly increase a voltage V1 applied to the series circuit with the transistor device 1 and the inductance Lp from zero to a predefined level at a first time instance t0. The transistor device 1 is driven such that it is in the off-state before the voltage V1 increases and after the voltage has increased. In this case, the drain source-voltage obtained by rapidly increasing the voltage V1 is equivalent to the drain-source voltage that is obtained when connecting the transistor device in series with a load, applying a constant voltage with a voltage level equal to the maximum level of voltage V1 to the series circuit, and switching the transistor device from the on-state to the off state. The inductance illustrated in FIG. 8 represents line inductances between the transistor device 1 and the load, for example.

As can be seen from FIG. 9, the drain-source voltage $V_{DS}$ starts to rapidly increase at the first time instance t0 and exceeds the maximum level of the voltage V1. This is due to an oscillation circuit formed by the inductance Lp and the first and second capacitors C1, C2 that include the first and second field electrodes 31, 32. In the example shown in FIG. 8, the transistor device 1 is represented by the equivalent circuit diagram shown in FIG. 3. This, however, is only an example. A transistor device having an equivalent circuit diagram of the type shown in FIG. 5 has an equivalent function.

Referring to FIG. 9, the drain-source voltage $V_{DS}$ oscillates after the first time instance t0 and finally approaches the upper voltage level of the supply voltage V1. In general, the greater the capacitance of a capacitor connected in series with the inductance Lp is, the higher the voltage peak of the drain-source voltage $V_{Ds}$. Due to the coupling circuit 4, this capacitance, at the beginning of the off-state, includes the capacitance of the first capacitor C1 and then increases when the coupling circuit 4 connects the second field electrode 32 to the source node S. Due to the lower capacitance at the beginning of the off-state the voltage peak in the transistor device of the type explained herein before is lower than the voltage peak occurring in a conventional transistor device that only includes one field electrode and one field electrode dielectric and has a capacitance that is essentially equal to the sum of the capacitances of the first and second capacitors C1, C2. Curve 202 shown in FIG. 9 represents the drain-source voltage $V_{DS}$ of such conventional transistor device.

According to one example, the first and second field electrode 31, 32 are implemented such that a ratio C1/C2 between a capacitance of the first capacitor C1 and the second capacitor C2 is between 0.5 and 2. According to another example, the first field electrode 31 is even omitted, so that the field electrode structure only includes the second field electrode 32.

Each of FIGS. 1, 2 and 4 illustrates a minimum configuration of the transistor device, wherein this minimum configuration includes one body region 12, one source region 13, one gate structure 21, 22, one field electrode structure 31-34, one drift region 11 and one drain region 14. This minimum configuration is also referred to as transistor cell 10 in the following. The transistor device 1 may include a plurality of transistor cells. These transistor cells are connected in parallel in that gate electrodes 21 of the individual transistor cells are connected to the gate node G, source and body regions 12, 13 of the individual transistor cells are connected to the source node S and drain regions 14 of the individual transistor cells are connected to the drain node D. According to one example, the drift regions 11 of the individual transistor cells are formed by one continuous semiconductor region, and the drain regions 14 of the individual transistor cells are formed by one continuous semiconductor region. Dependent on the specific geometry (shape) of the individual transistor cells the body regions 12 of two or more transistor cells may be formed by one continuous semiconductor region. Further, the gate electrodes 21 of two or more transistor cells may be formed by one continuous electrode.

Figure 10:
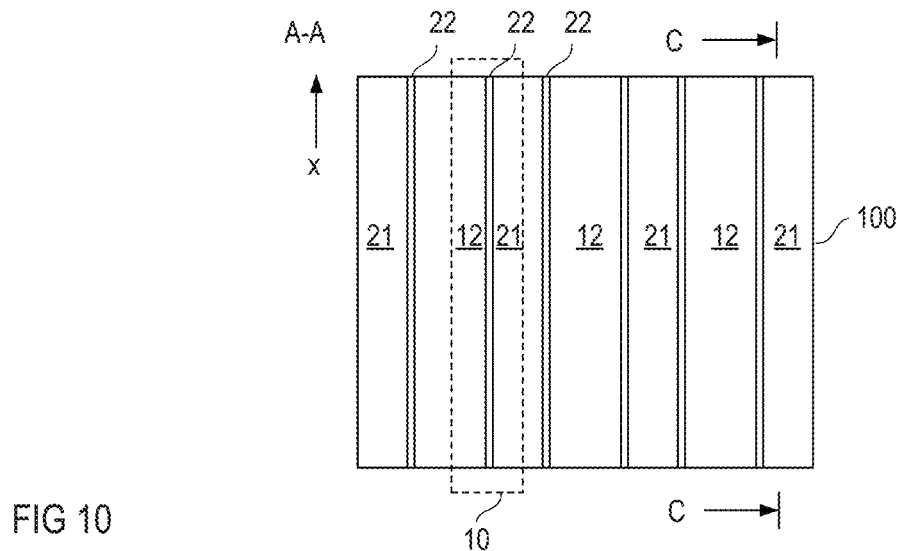
FIG. 10 shows a top view of one example of a transistor device of the type shown in FIG. 1.
Figure 11:
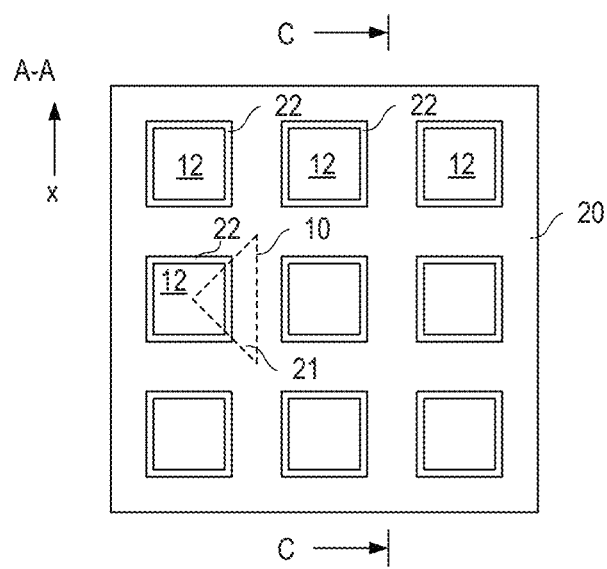
FIG. 11 shows a top view of another of a transistor device of the type shown in FIG. 1.

Two different examples of how transistor cells 10 of the transistor device 1 may be implemented are illustrated in FIGS. 10 and 11. Each of FIGS. 10 and 11 shows a horizontal cross sectional view of a transistor device of the type shown in FIG. 1 in a horizontal section plane A-A that cuts through the body regions 12, the gate electrodes 21 and the gate dielectrics 22 of the transistor cells 10. In the example shown in FIG. 10, the transistor cells 10 are elongated transistor cells (strip cells). In this example, the body regions 12 and the source regions 13 (which are out of view in FIG. 10) are elongated semiconductor regions in a first horizontal direction x of the semiconductor body 100, wherein the plurality of body regions 12 are essentially parallel. Consequently, the gate electrodes 21 are elongated electrodes that run parallel to the body regions 12 and are separated from the body regions 12 by the gate dielectrics 22. In this example, the body regions 12 of two neighboring transistor cells are formed by one common semiconductor region. Further, the gate electrodes 21 of two (other) neighboring transistor cells are formed by one common electrode.

In the example illustrated in FIG. 11, the transistor device 1 includes one grid-shaped electrode 20 that forms the gate electrodes 21 of the plurality of transistor cells 10. The body regions 12 are formed inside openings of the grid-shaped electrode 20. Just as an example, these openings are rectangular in the example illustrated in FIG. 11, wherein the body regions of four transistor cells 11 are formed by one semiconductor region formed in one of these openings. The individual transistor cells are triangular transistor cells 10 in this example. However, implementing the grid-shaped electrode 20 with rectangular openings, which results in triangular transistor cells 10, is only an example. The electrode 20 may be implemented with any other type of polygonal openings as well.

In the transistor device of the type shown in FIG. 1, the gate structure and the field electrode structure are located in the same trench of the semiconductor body 100. Consequently, in the examples shown in FIGS. 10 and 11, the first and second field electrodes 31, 32, which are out of view in these figures, have the same shape (geometry) as the gate electrodes 21. That is, in the example shown in FIG. 10, the first and second field electrodes 31, 32 are elongated field electrodes, and in the example shown in FIG. 11, the first and second field electrodes 31, 32 are grid-shaped electrodes.

Figure 12:
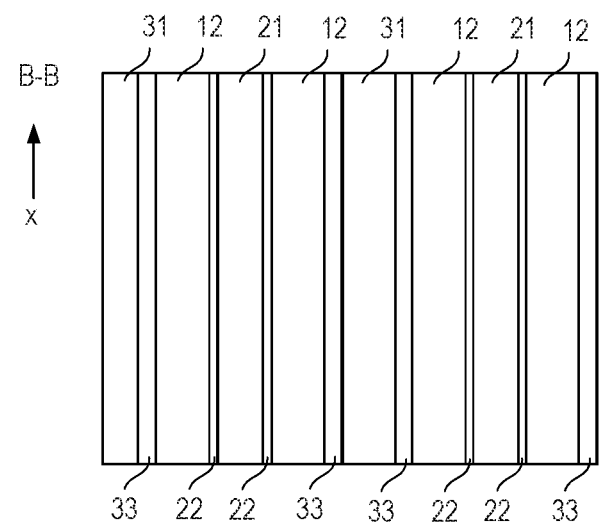
FIG. 12 shows a top view of one example of a transistor device of the type shown in FIGS. 2 and 4.

The transistor device of the type shown in FIGS. 2 and 4, in which the gate and field electrode structures are arranged in different trenches may be implemented with elongated transistor cells. This is illustrated in FIG. 12, which shows a horizontal cross sectional view of these transistor devices in a horizontal section plane B-B that cuts through the gate electrodes 21, the gate dielectrics 22, the body regions 12, the first field electrodes 31 and the first field electrode dielectrics 33. The body regions 12 (and the source regions 13, which are out of view in FIG. 12) are elongated semiconductor regions in this example. Equivalently, the gate electrodes 21, the first field electrodes 31 (and the second field electrodes 32) which are out of view in FIG. 12) are elongated electrodes, wherein the gate electrodes 21, the first field electrodes 31 and the body regions 12 are essentially parallel.

Figure 13:
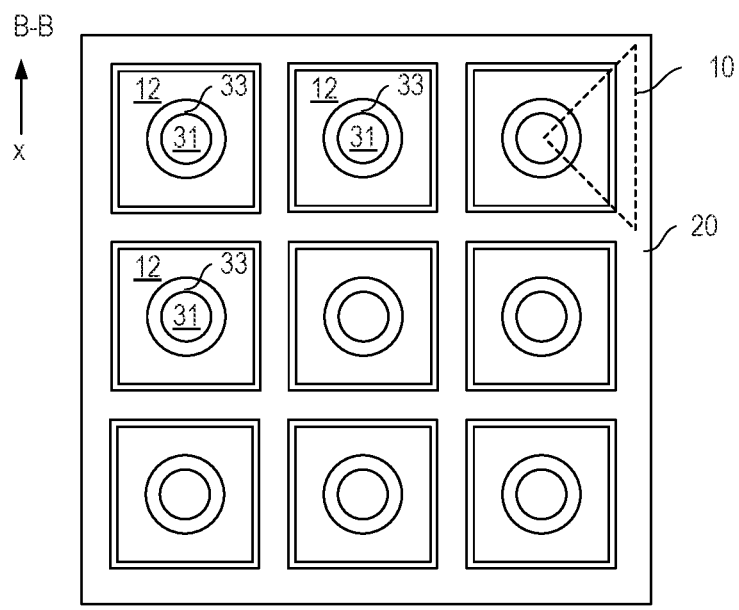
FIG. 13 shows a top view of another of a transistor device of the type shown in FIGS. 2 and 4.

FIG. 13 shows one example of a transistor device of the type shown in FIGS. 2 and 4 in which the gate electrodes 21 of the individual transistor cells 10 are formed by one grid-shaped electrode. The example illustrated in FIG. 13 is based on the example illustrated in FIG. 11. Everything put forward with regard to the form of the grid-shaped electrode and the body regions in context with the example illustrated in FIG. 11 applies to the example illustrated in FIG. 13 as well. The transistor device 1 shown in FIG. 13 is different from the transistor device 1 shown in FIG. 11 in that in the transistor device shown in FIG. 13 the field electrode structures are spaced apart from the grid-shape electrode 20. More specifically, the transistor device includes a plurality of field electrode structures, wherein each of these field electrode structures is arranged in a respective one of the openings of the grid-shaped electrode 20. These field electrode structures are referred to as needle-shaped or pin-shaped field electrode structures in the following.

The coupling circuit 4 may be implemented in various ways. Some examples of how the coupling circuit 4 can be implemented and of where the coupling circuit 4 can be arranged are explained in the following.

Figure 14:
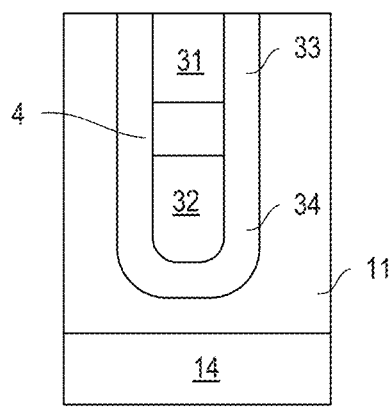
FIG. 14 shows one example of a field-electrode structure in which the coupling circuit and first and second field electrodes are arranged in the same trench.

In a transistor device of the type shown in FIG. 1, in which the gate structure and the field electrode structure are arranged in the same trench, the coupling circuit 4 can be implemented in this trench between the first field electrode 31 and the second field electrode 32. This is schematically illustrated in FIG. 14 that shows a vertical cross sectional view of one section of the transistor device. In this example, the coupling circuit 4 (which is only schematically illustrated in this figure) is arranged between the first field electrode 31 and the second field electrode 32 and is dielectrically insulated from the drift region 11 by the dielectric layer that forms the first and second field electrode dielectrics 33, 34.

Figure 15:
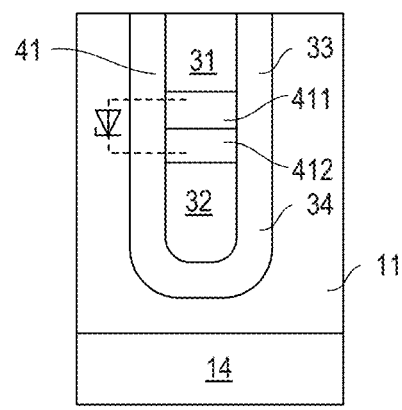
FIG. 15 shows one example of a coupling circuit of the type shown in FIG. 14 that includes a Zener diode.

Referring to the above, the coupling circuit 4 may include a Zener diode. One example of how such Zener diode may be implemented is illustrated in FIG. 15. In this example, the Zener diode 41 includes a first semiconductor region 411 and a second semiconductor region 412, wherein the first semiconductor region 411 adjoins the first field electrode 31 and the second semiconductor region 412 adjoins the second field electrode 32. Further, a pn-junction is formed between the first and second semiconductor regions 411, 412. The first semiconductor region 411 is a p-type semiconductor region of a first semiconductor material and the second semiconductor region 412 is an n-type semiconductor region of a second semiconductor material. A Zener voltage of the Zener diode 41 formed by first and second semiconductor region 411, 412 is defined by a doping concentration of the first and second semiconductor regions 411, 412. According to one example, a doping concentration of the p-type region 411 is selected from between $1E19$ $cm^{-3}$ and $1E21$ $cm^{-3}$ and a doping concentration of the n-type region 412 is selected from between $1E17$ $cm^{-3}$ and $5E19$ $cm^{-3}$. According to one example, at least one of the first and second semiconductor regions 411, 412 is a polycrystalline semiconductor region, wherein both of these first and second semiconductor regions 411, 412 may be implemented as polycrystalline semiconductor regions. The first and second field electrodes 31, 32 are metal electrodes according to one example.

Figure 16:
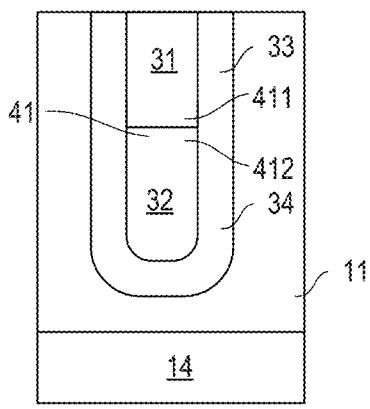
FIG. 16 shows another example of a coupling circuit of the type shown in FIG. 14 that includes a Zener diode.

FIG. 16 shows a modification of the transistor device shown in FIG. 15. In the example shown in FIG. 16, the first field electrode 31 is made of the first semiconductor material 411 and the second field electrode 32 is made of the second semiconductor material 412 so that the pn-junction is formed between the first and second field electrodes 31, 32.

A coupling circuit of the type illustrated in FIGS. 14 to 16 can be implemented in each of the transistor devices explained herein before. That is, this type of coupling circuit 4 can be implemented in transistor devices in which the gate structure and the field electrode structure are implemented in the same trench or in different trenches.

Figure 17:
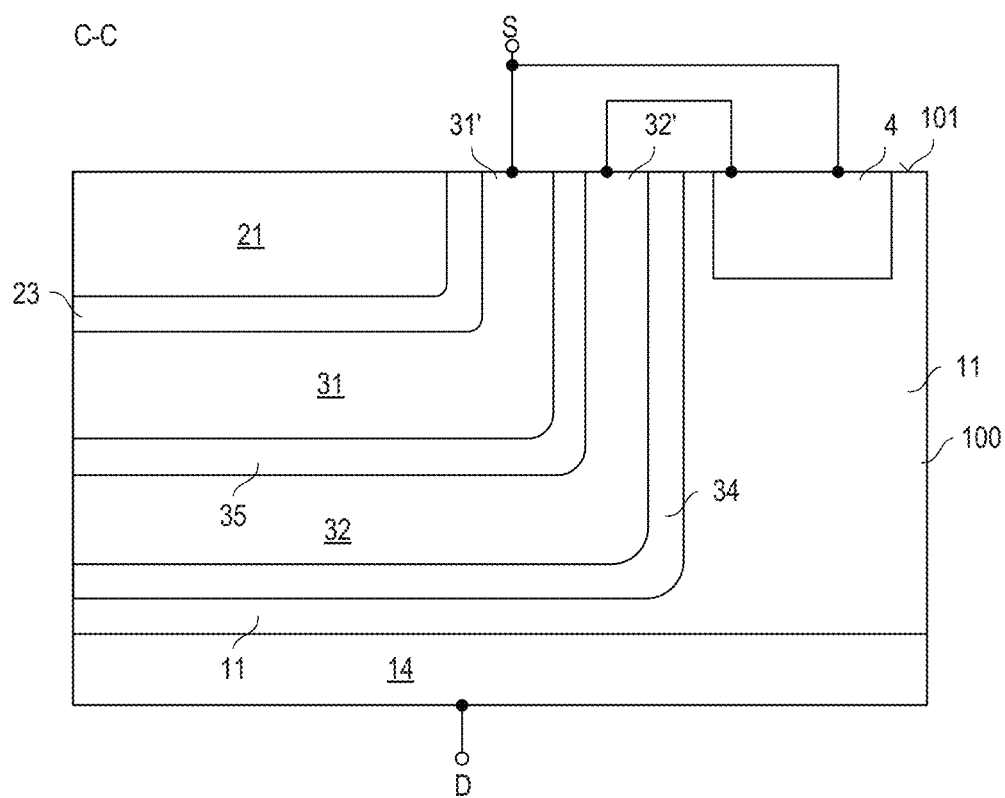
FIG. 17 shows one example of a field-electrode structure in which the coupling circuit is implemented outside a trench in which first and second field electrodes are arranged.

FIG. 17 illustrates one example of a transistor device in which the coupling circuit 4 is integrated in a region of the semiconductor body 100 that is spaced apart from the first and second field electrodes 31, 32. FIG. 17 shows a vertical cross sectional view of one example of the field electrode structure. In this example, the coupling circuit 4 is integrated in a region of the semiconductor body 100 that is close to the first surface 101 of the semiconductor body 100. The coupling circuit 4 is only schematically illustrated in FIG. 17.

The coupling circuit 4 is electrically connected to the source node S and the second field electrode 32, wherein electrical connections between the coupling circuit 4 and the source node S and the second field electrode 32, respectively, are only schematically illustrated in FIG. 17. In this example, the second field electrode 32 includes a contact section which, in the vertical direction of the semiconductor body 100, extends to the first surface 101. The coupling circuit 4 is connected to this contact section 32' of the second field electrode 32. Equivalently, the first field electrode 31 includes a contact section 31' that extends to the first surface 101 of the semiconductor body. This contact section 31' is connected to the source node S. The first and second field electrodes 31, 32 are electrically or dielectrically insulated from each other by an insulation layer 35. In the example illustrated in FIG. 17, the first and second field electrodes 31, 32 and the gate electrode 21 are arranged in the same trench. This, however, is only an example. According to another example (not shown), the first and second field electrodes 31, 32 are arranged in a trench that is spaced apart from the trench in which the gate electrode 21 is implemented.

The first and second field electrodes 31, 32 shown in FIG. 17 can be elongated field electrodes which may be implemented in a device of the type shown in FIG. 10 or a device of the type shown in FIG. 12. According to another example, the first and second field electrodes 31, 32 are grid-shaped and may be implemented in a device of the type shown in FIG. 11.

Figure 18:
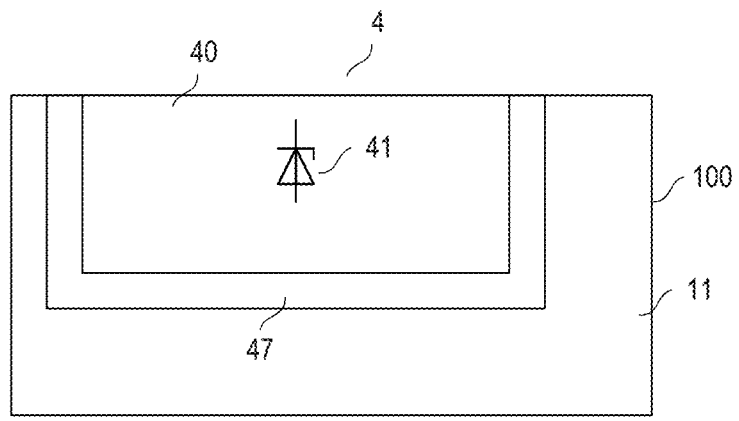
FIG. 18 shows one example of a dielectric isolation of the coupling circuit of the type shown in FIG. 17.

Referring to FIG. 18, the coupling circuit 4 can be integrated in a region of the semiconductor body 100 that is dielectrically insulated from other regions of the semiconductor body 100 by a dielectric layer 47.

Figure 19:
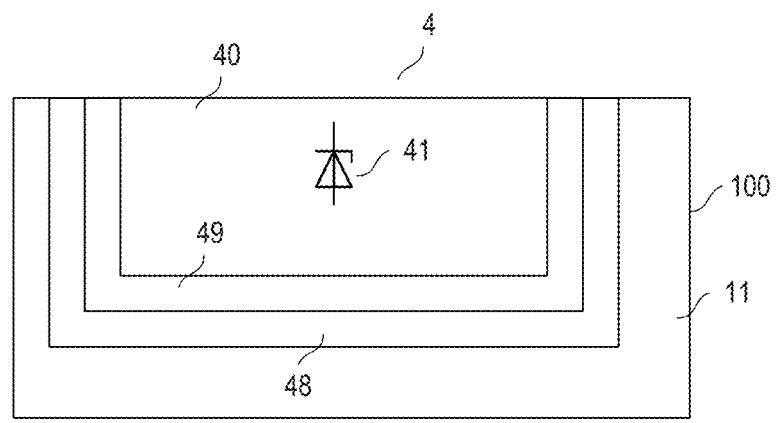
FIG. 19 shows one example of a junction isolation of the coupling circuit of the type shown in FIG. 17.

According to another example shown in FIG. 19, the coupling circuit 4 is integrated in a region of the semiconductor body that is insulated by a pn-junction from other regions of the semiconductor body 100. This pn-junction is formed between a first region 48 of one doping type and a second region 49 of another doping type complementary to the one doping type. The coupling circuit 4 is not shown in detail in the examples illustrated in FIGS. 18 and 19. The coupling circuit 4 may be implemented with a Zener diode 41 as explained with reference to FIG. 6 or with a thyristor 42 and a capacitor 43 as illustrated in FIG. 7. These electronic devices may be implemented in the region 40 illustrated in FIGS. 18 and 19.

Figure 20A:
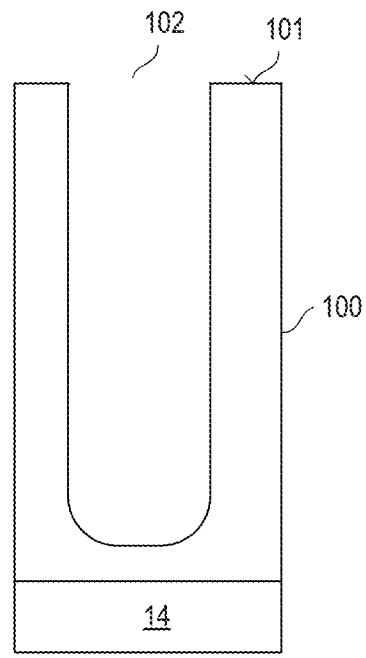
FIGS. 20A-20E illustrate one example of a method for forming a field electrode structure of the type shown in FIG. 14.
Figure 20B:
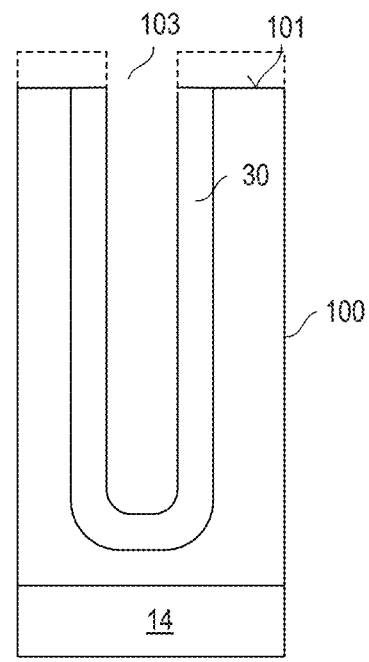

FIGS. 20A to 20E illustrate one example of a method for forming first and second field electrodes 31, 32 and a Zener diode 41 of the type illustrated in FIG. 16. Referring to FIG. 20A, the method includes forming a trench 102 in the first surface 101 of the semiconductor body 100. Forming the trench 102 may include a conventional trench etching process such as an anisotropic process, so that no further explanations are required in this regard. Referring to FIG. 20B, the method further includes forming a dielectric layer 30 at least on a bottom and on sidewalls of the trench 102. According to one example (illustrated in dashed lines in FIG. 20B), the dielectric layer 30 is also formed on top of the first surface 101. The dielectric layer 30 may include an oxide layer, a nitride layer or a layer stack including at least one oxide layer and at least one nitride layer. An oxide layer may be formed by a thermal oxidation process and/or a deposition process. A nitride layer may be formed by a deposition process.

Figure 20C:
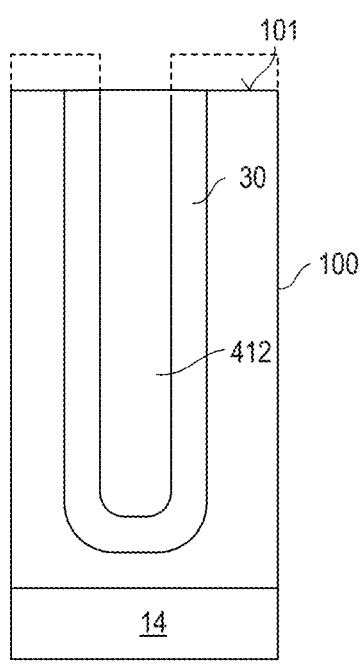
Figure 20D:
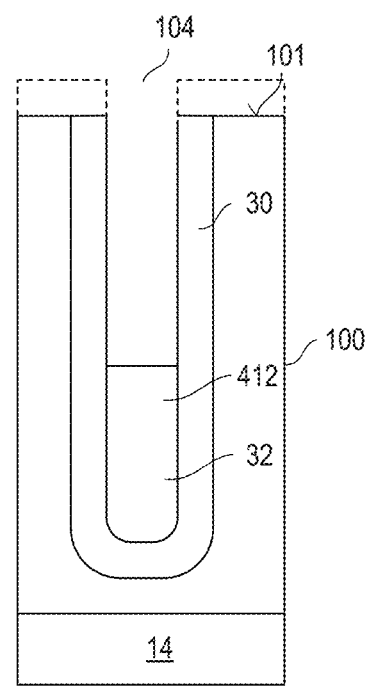

Referring to FIGS. 20C and 20D, the method further includes forming the second field electrode 32 in a residual trench 103 that remains after forming the dielectric layer 30. Forming the second field electrode 32 may include filling the residual trench 103 with the second semiconductor material and etching back this semiconductor material to such an extent that the second field electrode 32, which also forms the second semiconductor region 412 of the Zener diode, remains.

Figure 20E:
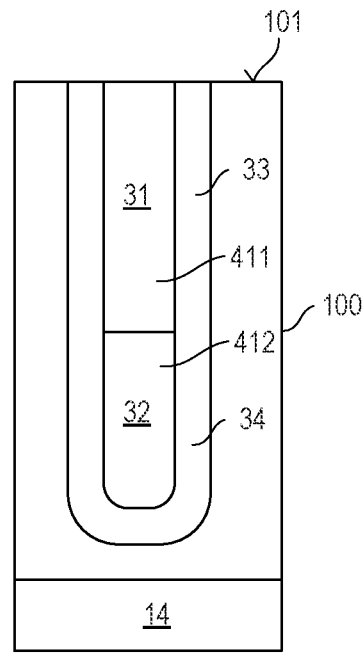

Referring to FIG. 20E, the method further includes forming the first field electrode 31 on top of the second field electrode 32. Forming the first field electrode 31 may include filling a residual trench 104 that remains after forming the second field electrode 32 at least partially with the first semiconductor material forming the first field electrode 31 and the first semiconductor region 411 of the Zener diode. The residual trench 104 can be completely filled with the first field electrode 31 in order to form a device of the type shown in FIGS. 2 and 4. According to another example, the dielectric layer 30 and the first field electrode 31 are removed from an upper section of the trench 102 and the gate dielectric 22 and the gate electrode 21 are formed in this upper section of the trench 102. This is illustrated in FIGS. 21A and 21B.

Figure 21A:
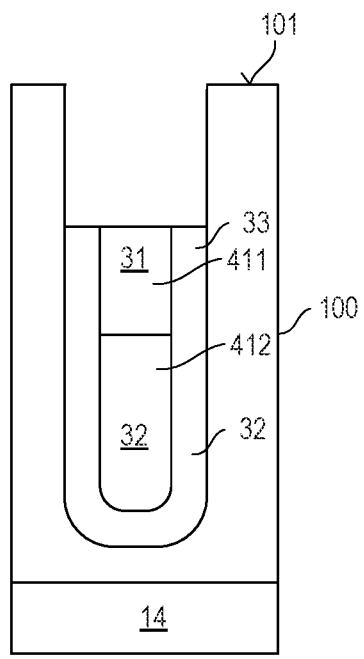
FIGS. 21A-21B illustrates a modification of the method shown in FIGS. 20A-20E.
Figure 21B:
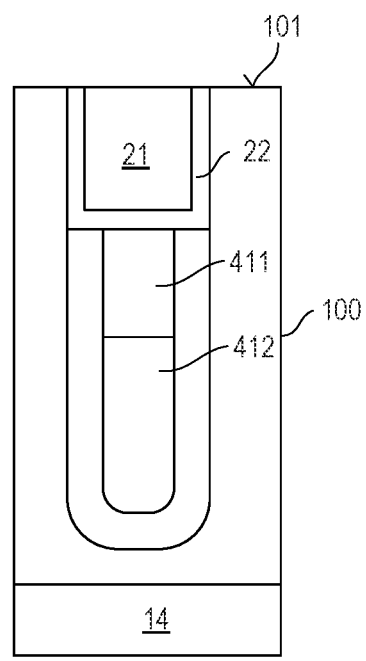

FIG. 21A shows a vertical cross sections view of the trench with the field electrode structure after removing the first field electrode 31 and the dielectric layer 30 from an upper section of the trench. FIG. 21B shows the structure shown in FIG. 21A after forming the gate dielectric 22 and the gate electrode 21. Forming the gate electric 22 may include a thermal oxidation process. Forming the gate electrode 21 may include filling a residual trench that remains after forming the gate dielectric 22 with a gate electrode material.

Although the present disclosure is not so limited, the following numbered examples demonstrate one or more aspects of the disclosure.

Example 1

A transistor device, including: in a semiconductor body, a drift region, a body region, and a source region separated from the drift region by the body region and connected to a source node; a gate electrode dielectrically insulated from the body region by a gate dielectric; and a field electrode structure, including: a first field electrode connected to the source node and dielectrically insulated from the drift region by a first field electrode dielectric; a second field electrode dielectrically insulated from the drift region by a second field electrode dielectric; and a coupling circuit connected between the second field electrode and the source node and configured to connect the second field electrode to the source node dependent on a voltage between the source node and the second field electrode.

Example 2

The transistor device of example 1, wherein the coupling circuit being configured to connect the second field electrode to the source node dependent on the voltage between the source node and the second field electrode includes that the coupling circuit is configured to connect the second field electrode to the source node when the voltage between the source node and the second field electrode exceeds a predefined voltage threshold.

Example 3

The transistor device of any combination of examples 1 to 2, wherein the coupling circuit includes a Zener diode connected between the second field electrode and the source node.

Example 4

The transistor device of any combination of examples 1 to 3, wherein the transistor device has a voltage blocking capability, and wherein the voltage threshold is between 5% and 20% of the voltage blocking capability or between 5V and 15V.

Example 5

The transistor device of any combination of examples 1 to 4, wherein the coupling circuit being configured to connect the second field electrode to the source node dependent on the voltage between the source node and the second field electrode includes that the coupling circuit is configured to connect the second field electrode to the source node when a rise rate of the voltage between the source node and the second field electrode exceeds a predefined rate threshold.

Example 6

The transistor device of any combination of examples 1 to 5, wherein the coupling circuit includes a thyristor connected between the second field electrode and the source node.

Example 7

The transistor device of any combination of examples 1 to 6, wherein the coupling circuit is connected to the source node via the first field electrode.

Example 8

The transistor device of any combination of examples 1 to 7, further including: a drain region spaced apart from the body region, wherein the second field electrode is located closer to the drain region than the first field electrode.

Example 9

The transistor device of any combination of examples 1 to 8, wherein the gate electrode and at least the first field electrode and the second field electrode are arranged in the same trench extending into the semiconductor body.

Example 10

The transistor device of any combination of examples 1 to 9, wherein the gate electrode is arranged in one trench extending into the semiconductor body and the first field electrode and the second field electrode are arranged in another trench extending into the semiconductor body.

Example 11

The transistor device of any combination of examples 1 to 10, wherein the coupling circuit, the first field electrode and the second field electrode are arranged in the same trench extending into the semiconductor body.

Example 12

The transistor device of any combination of examples 1 to 11, wherein the Zener diode includes: a first doped semiconductor region of a first doping type adjoining the first field electrode; and a second doped semiconductor region of a second doping type adjoining the second field electrode and forming a Zener junction with the first doped semiconductor region.

Example 13

The transistor device of any combination of examples 1 to 12, wherein at least one of the first and second field electrode includes a metal.

Example 14

The transistor device of any combination of examples 1 to 13, wherein the first field electrode includes a semiconductor material of the first doping type and the second field electrode includes a semiconductor material of the second doping type.

Example 15

The transistor device of any combination of examples 1 to 14, wherein the coupling circuit, the first field electrode and the second field electrode are arranged in the same trench extending into the semiconductor body, and wherein the coupling circuit is arranged outside the trench with the first field electrode and the second field electrode.

While the invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:

1. A transistor device, comprising:
in a semiconductor body, a drift region, a body region, and a source region separated from the drift region by the body region and connected to a source node;
a gate electrode dielectrically insulated from the body region by a gate dielectric; and
a field electrode structure, comprising:
a first field electrode connected to the source node and dielectrically insulated from the drift region by a first field electrode dielectric;
a second field electrode dielectrically insulated from the drift region by a second field electrode dielectric; and
a coupling circuit configured to electrically connect the second field electrode to the source node dependent on a voltage between the source node and the second field electrode,
wherein the coupling circuit is configured to electrically connect the second field electrode to the source node when the voltage between the source node and the second field electrode exceeds a voltage threshold of the coupling circuit,
wherein the transistor device has a voltage blocking capability,
wherein the voltage threshold of the coupling circuit is between 5% and 20% of the voltage blocking capability of the coupling circuit and/or the voltage threshold of the coupling circuit is between 5V and 15V.

2. The transistor device of claim 1, wherein the coupling circuit comprises a Zener diode connected between the second field electrode and the source node.

3. The transistor device of claim 2, wherein the Zener diode comprises:

a first doped semiconductor region of a first doping type adjoining the first field electrode; and
a second doped semiconductor region of a second doping type adjoining the second field electrode and forming a Zener junction with the first doped semiconductor region.

4. The transistor device of claim 3, wherein at least one of the first field electrode and the second field electrode comprises a metal.

5. The transistor device of claim 1, wherein the coupling circuit is connected to the source node via the first field electrode.

6. The transistor device of claim 1, further comprising:
a drain region spaced apart from the body region,
wherein the second field electrode is located closer to the drain region than the first field electrode.

7. The transistor device of claim 1, wherein the gate electrode and at least the first field electrode and the second field electrode are arranged in a same trench extending into the semiconductor body.

8. The transistor device of claim 1, wherein the gate electrode is arranged in a first trench extending into the semiconductor body, and wherein the first field electrode and the second field electrode are arranged in a second trench extending into the semiconductor body.

9. The transistor device of claim 8, wherein the first field electrode comprises a semiconductor material of the first doping type and the second field electrode comprises a semiconductor material of the second doping type.

10. The transistor device of claim 1, wherein the coupling circuit, the first field electrode and the second field electrode are arranged in a same trench extending into the semiconductor body.

11. The transistor device of claim 1, wherein the first field electrode and the second field electrode are arranged in a same trench extending into the semiconductor body, and wherein the coupling circuit is arranged outside the trench with the first field electrode and the second field electrode.

12. The transistor device of claim 1, wherein the coupling circuit comprises a Zener diode connected between the second field electrode and the source node.

13. The transistor device of claim 12, wherein the Zener diode comprises:
a first doped semiconductor region of a first doping type adjoining the first field electrode; and
a second doped semiconductor region of a second doping type adjoining the second field electrode and forming a Zener junction with the first doped semiconductor region.

14. The transistor device of claim 1, wherein the coupling circuit comprises a thyristor connected between the second field electrode and the source node.

15. A transistor device, comprising:
in a semiconductor body, a drift region, a body region, and a source region separated from the drift region by the body region and connected to a source node;
a gate electrode dielectrically insulated from the body region by a gate dielectric; and
a field electrode structure, comprising:
a first field electrode connected to the source node and dielectrically insulated from the drift region by a first field electrode dielectric;
a second field electrode dielectrically insulated from the drift region by a second field electrode dielectric; and a coupling circuit configured to electrically connect the second field electrode to the source node dependent on a voltage between the source node and the second field electrode, wherein the coupling circuit is configured to electrically connect the second field electrode to the source node when a rise rate of the voltage between the source node and the second field electrode exceeds a rate threshold of the coupling circuit.

16. The transistor device of claim 15, wherein the coupling circuit comprises a thyristor connected between the second field electrode and the source node.

17. A transistor device, comprising:
in a semiconductor body, a drift region, a body region, and a source region separated from the drift region by the body region and connected to a source node;
a gate electrode dielectrically insulated from the body region by a gate dielectric; and
a field electrode structure, comprising:
a first field electrode connected to the source node and dielectrically insulated from the drift region by a first field electrode dielectric;
a second field electrode dielectrically insulated from the drift region by a second field electrode dielectric; and
a coupling circuit configured to electrically connect the second field electrode to the source node dependent on a voltage between the source node and the second field electrode,
wherein the gate electrode is arranged in a first trench extending into the semiconductor body,
wherein the first field electrode and the second field electrode are arranged in a second trench extending into the semiconductor body.

18. The transistor device of claim 17, wherein the first field electrode comprises a semiconductor material of the first doping type and the second field electrode comprises a semiconductor material of the second doping type.

19. A transistor device, comprising:
in a semiconductor body, a drift region, a body region, and a source region separated from the drift region by the body region and connected to a source node;
a gate electrode dielectrically insulated from the body region by a gate dielectric; and
a field electrode structure, comprising:
a first field electrode connected to the source node and dielectrically insulated from the drift region by a first field electrode dielectric;
a second field electrode dielectrically insulated from the drift region by a second field electrode dielectric; and
a coupling circuit configured to electrically connect the second field electrode to the source node dependent on a voltage between the source node and the second field electrode,
wherein the coupling circuit comprises a thyristor connected between the second field electrode and the source node.

20. The transistor device of claim 19, wherein the thyristor is configured to electrically connect the second field electrode to the source node when the thyristor receives a current pulse with a current level higher than a threshold current level of the thyristor.

21. The transistor device of claim 20, wherein the coupling circuit further comprises a capacitor connected to a gate node of the thyristor, wherein the capacitor is configured to generate the current pulse when a drain-source voltage of the transistor device increases, and wherein a current level of the current pulse is dependent on a rise rate of the drain-source voltage and a capacitance of the capacitor.

* * * * *